US012685169B2

(12) United States Patent
Arora et al.

(10) Patent No.: US 12,685,169 B2
(45) Date of Patent: Jul. 14, 2026

(54) FLIP CHIP PACKAGED DEVICES WITH THERMAL INTERPOSER

(71) Applicant: Texas Instruments Incorporated, Dallas, TX (US)

(72) Inventors: Vivek Arora, San Jose, CA (US); Woochan Kim, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 128 days.

(21) Appl. No.: 17/404,765

(22) Filed: Aug. 17, 2021

(65) Prior Publication Data

US 2023/0059142 A1 Feb. 23, 2023

(51) Int. Cl.
| | |
|---|---|
| *H10W 40/77* | (2026.01) |
| *H10W 70/40* | (2026.01) |
| *H10W 72/00* | (2026.01) |
| *H10W 72/90* | (2026.01) |
| *H10W 74/10* | (2026.01) |
| *H10W 72/29* | (2026.01) |
| *H10W 90/00* | (2026.01) |

(52) U.S. Cl.
CPC ....... *H10W 40/778* (2026.01); *H10W 70/456* (2026.01); *H10W 72/0198* (2026.01); *H10W 72/90* (2026.01); *H10W 74/111* (2026.01); *H10W 72/07236* (2026.01); *H10W 72/29* (2026.01); *H10W 72/877* (2026.01); *H10W 90/726* (2026.01); *H10W 90/734* (2026.01)

(58) Field of Classification Search
CPC ......... H01L 24/05; H01L 24/16; H01L 24/32; H01L 24/94

USPC .......................................................... 257/666
See application file for complete search history.

(56) References Cited

U.S. PATENT DOCUMENTS

| | | | | |
|---|---|---|---|---|
| 5,378,924 A | * | 1/1995 | Liang ................ | H01L 23/49568 257/676 |
| 2006/0151861 A1 | * | 7/2006 | Noquil .................. | H01L 23/488 257/E23.101 |
| 2007/0290303 A1 | * | 12/2007 | Lange ................. | H01L 23/3107 257/E23.045 |

(Continued)

FOREIGN PATENT DOCUMENTS

| | | | | | |
|---|---|---|---|---|---|
| JP | 2012195546 A | * | 10/2012 | ............. | H01L 24/32 |

Primary Examiner — Norman D Richards
Assistant Examiner — Laura M Dykes
(74) Attorney, Agent, or Firm — Xiaotun Qiu; Frank D. Cimino

(57) ABSTRACT

In a described example, an apparatus includes: a package substrate having a die mount surface; semiconductor die flip chip mounted to the package substrate on the die mount surface, the semiconductor die having post connects having proximate ends on bond pads on an active surface of the semiconductor die, and extending to distal ends away from the active surface of the semiconductor die and connected to the package substrate by solder joints; a thermal interposer comprising a thermally conductive material positioned over and in thermal contact with a backside surface of the semiconductor die; and mold compound covering a portion of the package substrate, a portion of the thermal interposer, the semiconductor die, and the post connects, the thermal interposer having a surface exposed from the mold compound.

15 Claims, 13 Drawing Sheets

(56)     References Cited

U.S. PATENT DOCUMENTS

| | | | |
|---|---|---|---|
| 2008/0315405 A1* | 12/2008 | Yeh ..................... H01L 23/4334 | |
| | | | 257/E23.101 |
| 2009/0115035 A1* | 5/2009 | Bayan ..................... H01L 24/49 | |
| | | | 257/E23.048 |
| 2011/0221047 A1* | 9/2011 | Yang ................. H01L 23/49572 | |
| | | | 257/E23.033 |
| 2012/0153446 A1* | 6/2012 | Jiang ....................... H01L 23/36 | |
| | | | 438/122 |
| 2013/0043595 A1* | 2/2013 | Williams ......... H01L 23/49572 | |
| | | | 257/773 |
| 2016/0035645 A1* | 2/2016 | Olsen ............... H01L 23/49861 | |
| | | | 257/712 |
| 2016/0126166 A1* | 5/2016 | Shi ......................... H01L 24/17 | |
| | | | 438/112 |
| 2016/0293514 A1* | 10/2016 | Lin ..................... H01L 21/6836 | |
| 2016/0351549 A1* | 12/2016 | Lin ......................... H01L 21/50 | |
| 2017/0018505 A1* | 1/2017 | Lin .................... H01L 23/3121 | |
| 2017/0025393 A1* | 1/2017 | Lin ......................... H01L 21/54 | |

* cited by examiner

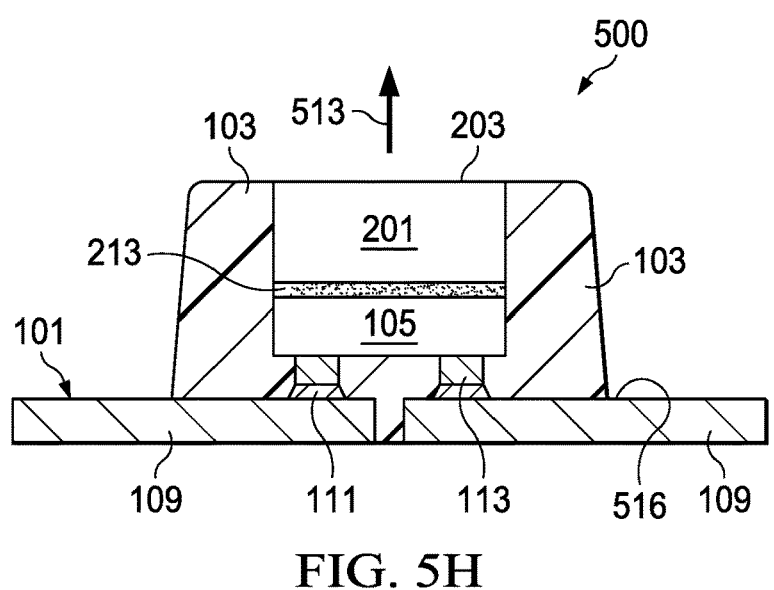

FIG. 5H

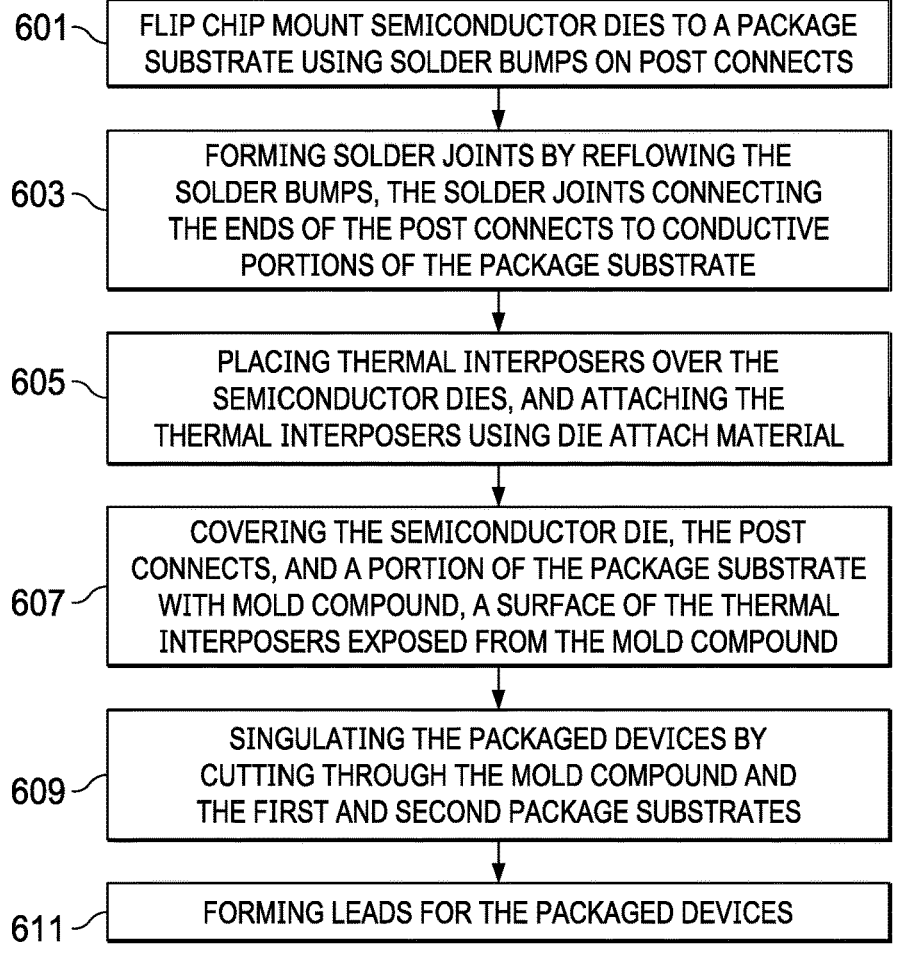

601 — FLIP CHIP MOUNT SEMICONDUCTOR DIES TO A PACKAGE SUBSTRATE USING SOLDER BUMPS ON POST CONNECTS

603 — FORMING SOLDER JOINTS BY REFLOWING THE SOLDER BUMPS, THE SOLDER JOINTS CONNECTING THE ENDS OF THE POST CONNECTS TO CONDUCTIVE PORTIONS OF THE PACKAGE SUBSTRATE

605 — PLACING THERMAL INTERPOSERS OVER THE SEMICONDUCTOR DIES, AND ATTACHING THE THERMAL INTERPOSERS USING DIE ATTACH MATERIAL

607 — COVERING THE SEMICONDUCTOR DIE, THE POST CONNECTS, AND A PORTION OF THE PACKAGE SUBSTRATE WITH MOLD COMPOUND, A SURFACE OF THE THERMAL INTERPOSERS EXPOSED FROM THE MOLD COMPOUND

609 — SINGULATING THE PACKAGED DEVICES BY CUTTING THROUGH THE MOLD COMPOUND AND THE FIRST AND SECOND PACKAGE SUBSTRATES

611 — FORMING LEADS FOR THE PACKAGED DEVICES

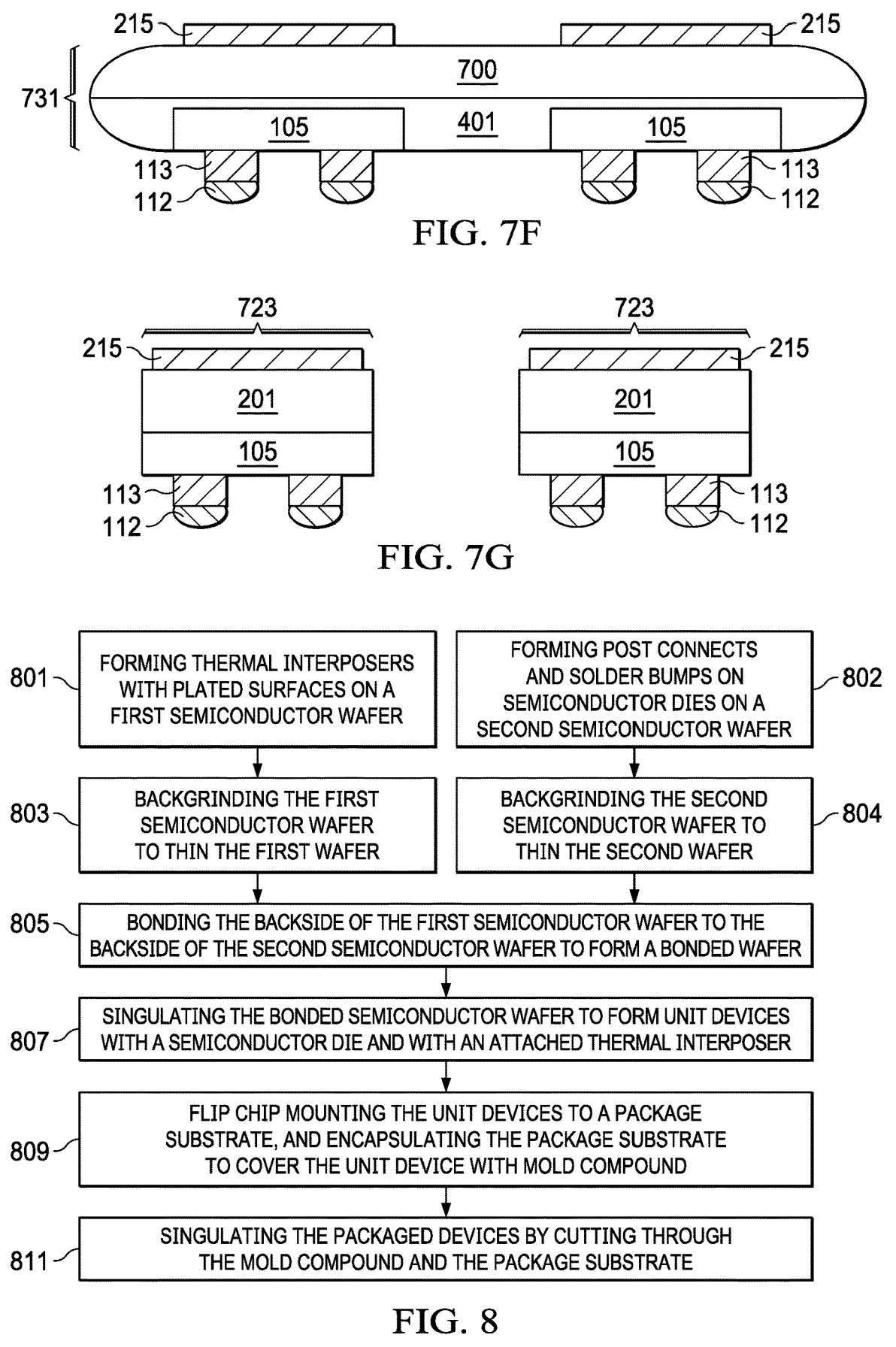

| 801 | FORMING THERMAL INTERPOSERS WITH PLATED SURFACES ON A FIRST SEMICONDUCTOR WAFER | FORMING POST CONNECTS AND SOLDER BUMPS ON SEMICONDUCTOR DIES ON A SECOND SEMICONDUCTOR WAFER | 802 |
|---|---|---|---|
| 803 | BACKGRINDING THE FIRST SEMICONDUCTOR WAFER TO THIN THE FIRST WAFER | BACKGRINDING THE SECOND SEMICONDUCTOR WAFER TO THIN THE SECOND WAFER | 804 |

805 — BONDING THE BACKSIDE OF THE FIRST SEMICONDUCTOR WAFER TO THE BACKSIDE OF THE SECOND SEMICONDUCTOR WAFER TO FORM A BONDED WAFER

807 — SINGULATING THE BONDED SEMICONDUCTOR WAFER TO FORM UNIT DEVICES WITH A SEMICONDUCTOR DIE AND WITH AN ATTACHED THERMAL INTERPOSER

809 — FLIP CHIP MOUNTING THE UNIT DEVICES TO A PACKAGE SUBSTRATE, AND ENCAPSULATING THE PACKAGE SUBSTRATE TO COVER THE UNIT DEVICE WITH MOLD COMPOUND

811 — SINGULATING THE PACKAGED DEVICES BY CUTTING THROUGH THE MOLD COMPOUND AND THE PACKAGE SUBSTRATE

FIG. 8

FLIP CHIP PACKAGED DEVICES WITH THERMAL INTERPOSER

TECHNICAL FIELD

This relates generally to packaging electronic devices, and more particularly to flip chip mounted dies in molded device packages.

BACKGROUND

Processes for producing packaged electronic devices include mounting the electronic devices to a package substrate, and covering the electronic devices with mold compounds to form packages. The molding processes may be done on single devices, or may be done on multiple electronic devices simultaneously. The devices may be arranged in a strip of devices adjacent to one another, or in a two dimensional array of devices in rows and columns on a package substrate, such as lead frame strips or arrays. Once the packaged devices are complete, the devices are separated from one another. In one method to separate the devices from one another, a saw is used. The saw cuts through the mold compound and through the package substrate material along saw streets defined between the electronic devices, in order to separate the devices. Other cutting tools such as lasers can be used.

Small outline transistor (SOT) packages are used when an electronic device has a few terminals, such as a power transistor device, a sensor, or an analog device. Flip chip mounted semiconductor devices can be used to form an SOT package. Flip chip mounting on a lead frame (FCOL) replaces wire bonded, face up packages and can reduce problems associated with bond wires. When devices are mounted on package substrates using flip chip packages, a semiconductor die has conductive post connects that extend from a proximal end placed on bond pads on an active surface of the semiconductor die to a distal end having a solder ball or solder bump. In a flip chip package the semiconductor die is mounted with the active surface facing the package substrate. When the semiconductor die is flip chip mounted to the package substrate, the solder bumps at the distal end of the post connects are heated and allowed to reflow to form solder joints. The solder joints provide a mechanical connection to the package substrate and electrically couple the semiconductor die to traces or leads on the package substrate. The solder joints couple the conductive post connects to a conductive area on the package substrate.

Some semiconductor devices, such as power transistors which deliver power in the form of current or voltage to a load, generate substantial heat when operating. In an SOT package, the semiconductor die can be isolated from the system board by the mold compound, and by ambient atmosphere, so that the heat from the semiconductor die is transferred away from the package using the package leads, which is inefficient. To increase performance and power handling capabilities for packaged devices in molded packages, thermal dissipation from the package needs to be increased.

SUMMARY

In a described example, an apparatus includes: a package substrate having a die mount surface; a semiconductor die flip chip mounted to the package substrate on the die mount surface, the semiconductor die having post connects having proximate ends on bond pads on an active surface of the semiconductor die, and extending to distal ends away from the active surface of the semiconductor die and connected to the package substrate by solder joints; a thermal interposer comprising a thermally conductive material positioned over and in thermal contact with a backside surface of the semiconductor die; and mold compound covering a portion of the package substrate, a portion of the thermal interposer, the semiconductor die, and the post connects, the thermal interposer having a surface exposed from the mold compound.

BRIEF DESCRIPTION OF THE DRAWINGS

FIGS. 5A-5H illustrate, in a series of cross sectional views and side views, major steps in manufacturing a flip chip packaged electronic device of the arrangements.

FIG. 6 illustrates in a flow diagram selected steps of a method for forming the arrangements.

FIGS. 7A-7G illustrate, in a series of cross sectional views, major steps for forming an additional arrangement.

FIG. 8 illustrates in a flow diagram selected steps of a method for forming the arrangements.

DETAILED DESCRIPTION

Figure 1A:
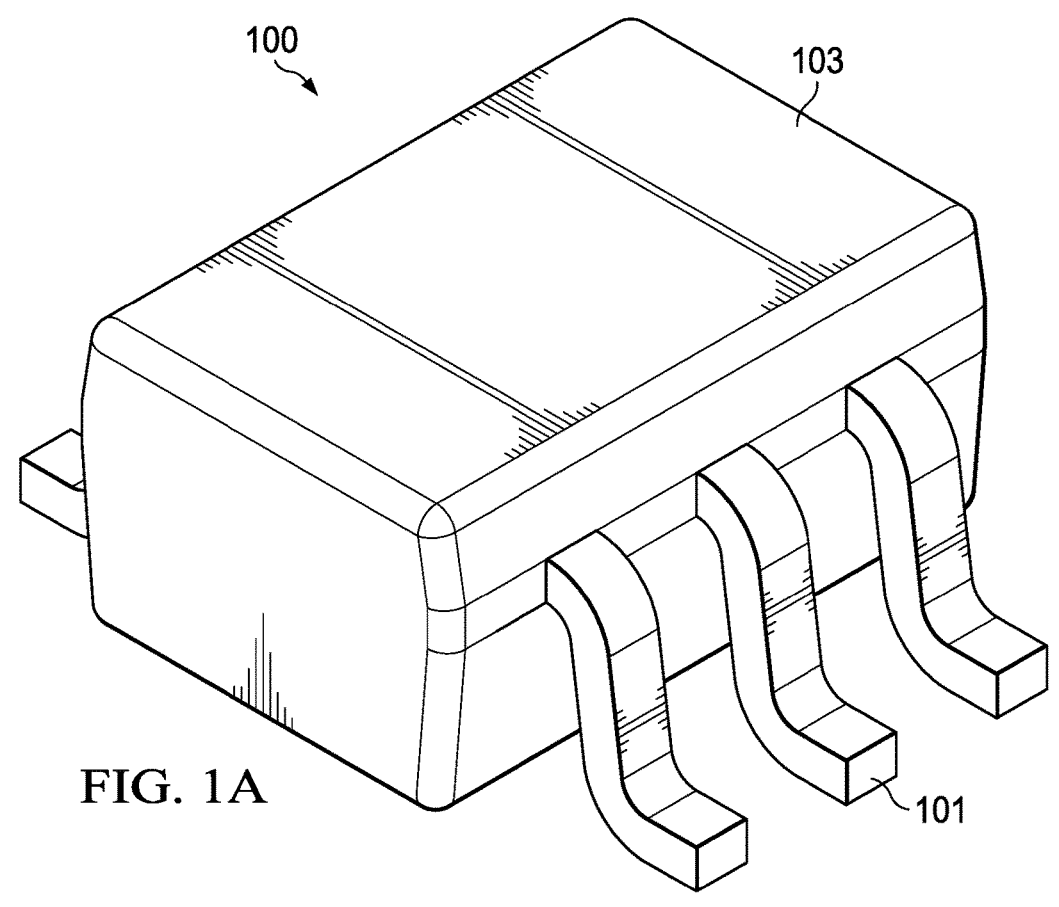
FIGS. 1A-1C illustrate in a projection view, a cross sectional view, and a partially exploded projection view, respectively, a small outline transistor (SOT) package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power field effect transistor (FET) switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electro-mechanical system (MEMS) device, such as a digital micromirror device (DMD).

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or a controller die) can be packaged together to from a single packaged electronic device. Additional components such as passives can be included in the packaged electronic device. The semiconductor die is mounted to a substrate that provides conductive leads, a portion of the conductive leads form the terminals for the packaged electronic device. The semiconductor die can be mounted to the substrate with an active device surface facing away from the substrate and a backside surface facing and mounted to the substrate. Alternatively, the semiconductor die can be flip chip mounted with the active surface facing the substrate surface, and the semiconductor die mounted to the leads of the substrate by conductive post connects carrying solder balls. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the package substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates useful with the arrangements include conductive lead frames, which can be formed from copper, aluminum, stainless steel and alloys such as Alloy 42 and copper alloys. The lead frames can include a die mounting area for mounting a semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad for the packaged devices, and die attach or die adhesive can be used to mount the dies to the lead frame die pads. In wire bonded packages, wire bonds can couple bond pads on the semiconductor dies to the leads of the lead frames. After the wire bonds are in place, a portion of the substrate, the die, and at least a portion of the die pad can be covered with a protective material such as a mold compound. In FCOL packages, conductive post connects are formed on an active surface of a semiconductor die and extend from bond pads on the active surface as pillars, rails, or posts. The post connects end in a solder bump or solder column portion at the distal end of the post connects. The solder can be used in a thermal reflow process to mount the semiconductor die to a package substrate, such as a lead frame, in a flip chip mounting arrangement. The solder joints that are formed provide electrical and mechanical connection between the semiconductor die and the package substrate.

Alternative package substrates include pre-molded lead frames (PMLF) and molded interconnect substrates (MIS) for receiving semiconductor dies. These package substrates can include dielectrics such as liquid crystal polymer (LCP) or mold compound, and can include one or more layers of conductive portions in the dielectrics. Repeated plating and patterning can form multiple layers of conductors spaced by dielectrics, and conductive vias connecting the conductor layers through the dielectrics, the dielectrics can be mold compound. The package substrate can include lead frames, and can include plated, stamped and partially etched lead frames. In a partially etched lead frame, two levels of metal can be formed by etching a pattern from one side of a metal substrate configured for lead frames, and then etching from the other side, to form full thickness and partial thickness portions, and in some areas, all of the metal can be etched through to form openings through the partial etch lead frames. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as flame retardant 4 (FR4) can be used as the package substrates.

The term "post connect" is used herein. As used herein, a post connect is a structure made of a conductive material, for example copper or copper alloys, gold or gold alloys, or combinations of conductive metal that provides a connection between a semiconductor die and a package substrate. A proximate end of the post connect is mounted to a bond pad on the active surface of a semiconductor die, while a distal end of the post connect is extended away from the bond pad of the semiconductor die. When the packaged semiconductor device is oriented with the semiconductor die positioned above and facing a die mount surface of a package substrate in a flip chip orientation, the post connect makes a vertical connection between a conductive portion of the package substrate and the bond pad of the semiconductor die. Some references describe a type of post connect as a "controlled collapse chip connection" or as "C4" bumps. The conductive post connect includes a post of conductor material and a solder bump or ball at the distal end facing away from the surface of the bond pad on the semiconductor die, where a proximal end of the post connect is mounted to the bond pad. The conductive material remains intact after the solder bump is melted during a solder reflow process, the conductive material controlling the vertical spacing or controlling the vertical "collapse" of the post connect structure during solder reflow.

A package substrate, such as a lead frame, MIS, or PMLF substrate, will have conductive portions on a die side surface. Leads of a metal lead frame are conductive all along the surfaces, while for other substrate types, conductive lands in dielectric substrate material are arranged and aligned to electrically and mechanically connect to the conductive post connects. The post connects can extend along the same direction as a conductive lead in the package substrate, so that the post connect is a rail or rectangle shape. Solder will be formed at the distal end of the post connect. When the post connect is copper and is pillar shaped and is solder bumped at the end, it may be referred to as a "copper pillar bump." A copper pillar bump or copper bump is therefore an example of a post connect. In addition to a pillar shape, the post connect can also be a column, rectangle or rail shape, and can have an oval, round, square or rectangular cross section. In examples, multiple post connects can be arranged in parallel to one another with additional post connects coupled to a common trace on a package substrate, to provide a low resistance path between the semiconductor die and the package substrate. The post connects can also transfer thermal energy away from the semiconductor die to a package substrate and out of the package. The solder bumps at the ends of the post connects are used in a thermal reflow process to make solder joints. The solder joint provides both a mechanical attachment and an electrical connection between the semiconductor die and the package substrate. Post connects are used to form several, tens, hundreds or thousands of connections between a semiconductor die and a substrate in fine pitch semiconductor packages. In a discrete device package or power transistor package, only a few post connects may be used. The conductive post connects can be, in some examples, a uniform size and have uniform or minimum pitch between them. In other examples, the size of the post connects can be made larger for power terminals or for high current signals, and smaller for control signals or logic signals that require less current, and may have varying spacing distances. Multiple post connects can be coupled in parallel to reduce resistance for certain signals, such as a high current signal, power or ground signal. Post connects can vary in size and shape, but in examples range from 10-70 microns in diameter, and may range from 20-50 microns in height from the bond pad surface on the semiconductor die. The solder ball or bump may have a height from 5-15 microns, so that the total height of the post connect and bump may range from 25-65 microns. As device sizes continue to fall and the density of connections rises, these sizes may decrease.

The term "thermal interposer" is used herein. As used herein, a thermal interposer is a piece of thermally conductive material placed in a semiconductor device package to conduct thermal energy away from a semiconductor die. In the arrangements, a thermal interposer is placed over a backside surface of a flip chip mounted semiconductor die and is thermally coupled to the die, for example by a die attach material. A mold compound forms a package body including the semiconductor die and the thermal interposer, while a surface of the thermal interposer is exposed from the mold compound. In example arrangements, the thermal interposer is formed of a semiconductor material, and in a particular example arrangement, the thermal interposer is silicon. Alternative materials with CTEs similar to semiconductor dies can be useful with the arrangements, examples include ceramics such as aluminum oxide ($Al_2O_3$) (sometimes called "alumina") and aluminum nitride (AlN). Semiconductor material as a thermal interposer is simple to implement in a packaging process of the arrangements and is low in cost, while using ceramic materials as the thermal interposers may increase costs over silicon, for example.

In packaging semiconductor devices, a mold compound may be used to partially cover a package substrate, to cover the semiconductor die, and to cover the connections from the semiconductor die to the package substrate. This can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed. Transfer molding can be used. Unit molds shaped to surround an individual device may be used, or block molding may be used, to form the packages simultaneously for several devices from mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device. Flip chip mounted devices can be used. In flip chip mounting, solder balls, solder columns, or solder bumps are formed on the conductive post connects. The post connects are formed extending from bond pads of the semiconductor die. The semiconductor die is then oriented with the solder bumps at the distal ends of the post connects facing a die mounting surface of a circuit board or substrate. A solder reflow process is used to attach the solder bumps to the conductive die pads or leads on the package substrate, the solder forming a physical attachment and an electrical connection between the package substrate and the semiconductor die. Mold compound or other protective dielectric material can cover the die and a portion of the package substrate to complete the flip chip package.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No-lead packaged electronic devices can be surface mounted to a board. Leaded packages can be used with the arrangements where the leads extend away from the package body and are shaped to form a portion for soldering to a board. A dual in line package (DIP) can be used with the arrangements. A small outline package (SOP) can be used with the arrangements. SON packages can be used, and in an alternative a small outline transistor (SOT) package is a leaded package that can be used with the arrangements.

In the arrangements, a package includes a semiconductor die that is flip chip mounted to a package substrate. A thermal interposer is placed in thermal contact with a backside surface of the semiconductor die. The semiconductor die, package substrate and the thermal interposer are encapsulated in mold compound to form a packaged device. In example arrangements, the thermal interposer has a surface that is exposed from the mold compound on a board side or "bottom" surface of the device package. When the device package is mounted to a printed circuit board, the thermal interposer can be soldered or placed in thermal contact to a thermal pad on the printed circuit board to make an efficient thermal transfer path to the printed circuit board. In another example arrangement, the package substrate can be arranged so that the thermal interposer is at the top side of the molded package and has a surface exposed from the package formed by the mold compound to provide "top side cooling," allowing the heat from the semiconductor die to be transferred away from a system board. The arrangements can be used with leaded and no-lead package types where a semiconductor die is flip chip mounted to a package substrate. In example arrangements the thermal interposer can be silicon. In additional arrangements the thermal interposer can be a semiconductor material or a ceramic material. In additional arrangements, the semiconductor die and the thermal interposer can be assembled together in a wafer level processing (WLP) method, using semiconductor wafers bonded together prior to being singulated into unit devices, which can then be flip chip mounted on a package substrate, encapsulated and then the completed packaged devices can be sawed apart.

Figure 1B:
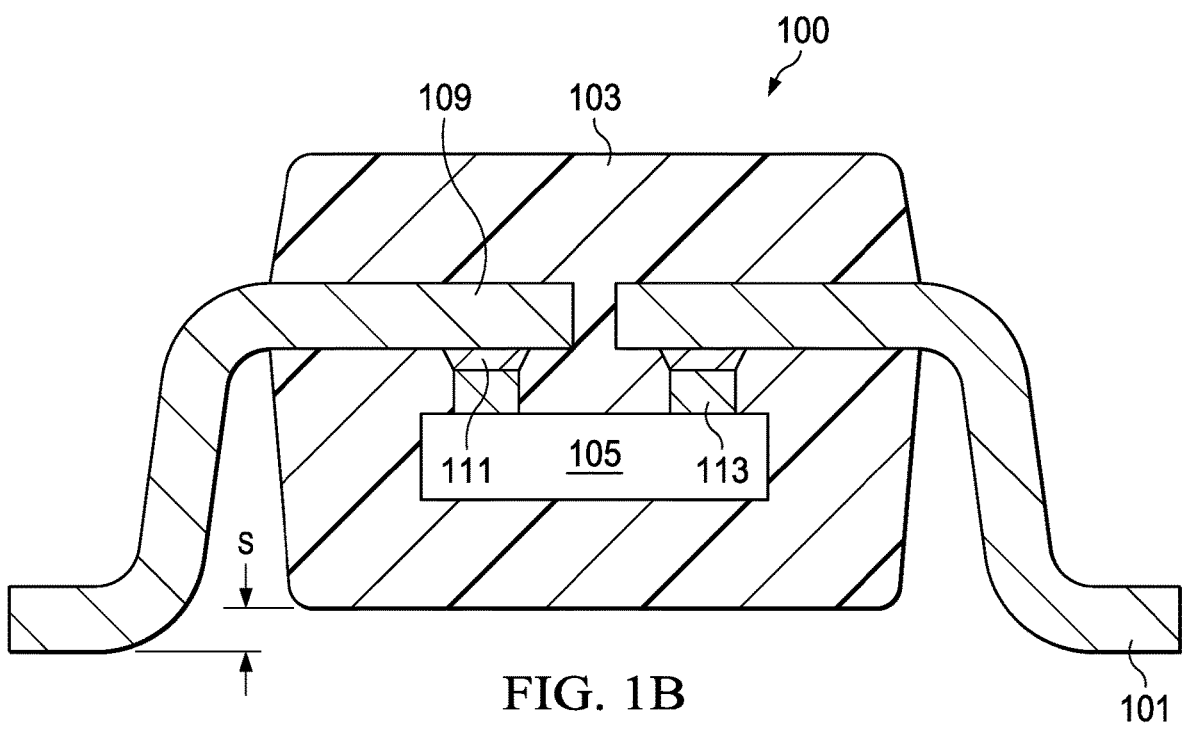
Figure 1C:
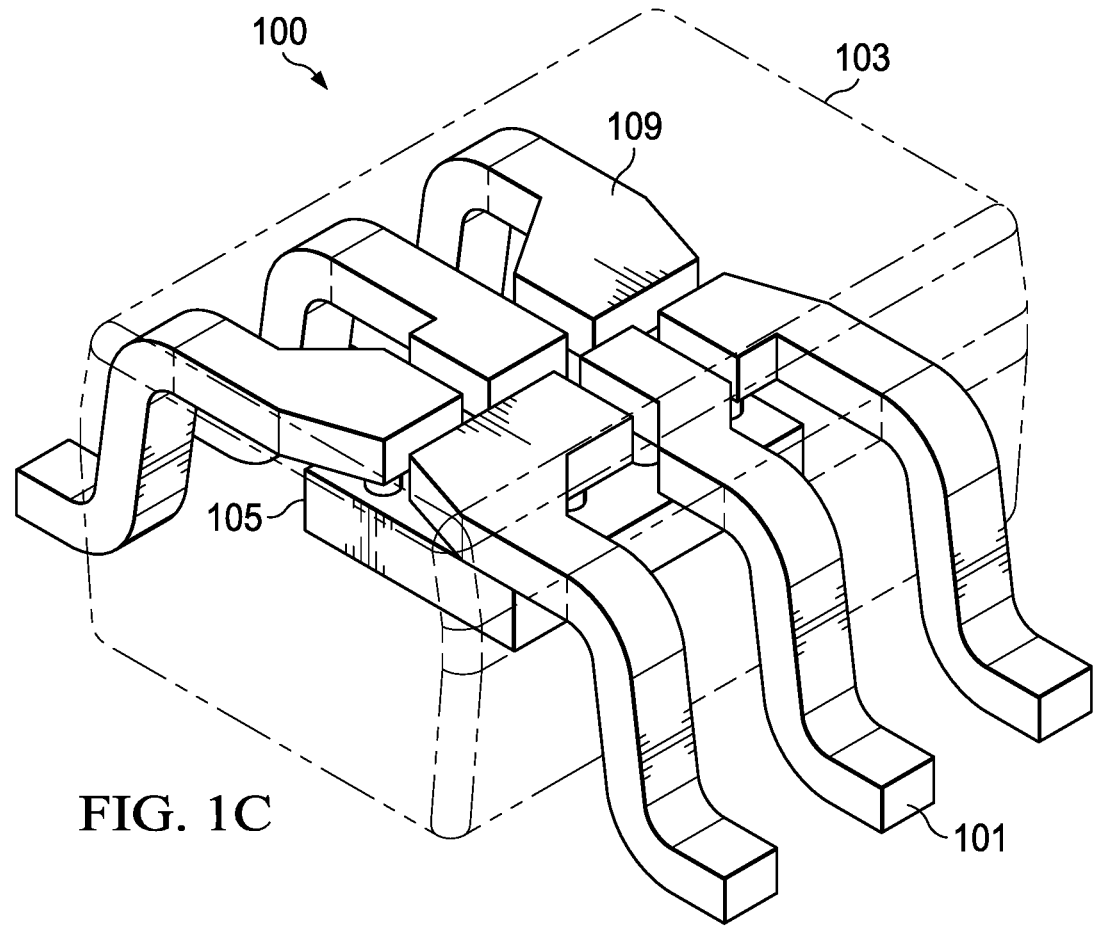

FIGS. 1A-1C illustrate in a projection view, a cross section, and an exploded projection view, respectively, an electronic device package 100 in a small outline transistor (SOT) package. SOT packages are used for low terminal count devices such as passive components, transistors, and analog circuits. The package 100 has a body formed from a mold compound 103, such as thermoset epoxy resin. Other mold compounds, such as resins, epoxies, or plastics can be used. Leads 101 are part of a package substrate 109 (not visible in FIG. 1A, see FIG. 1B) that supports a semiconductor die 105 (not visible in FIG. 1A, as it is obscured by the package body, see FIG. 1B) within the package 100, portions of the leads 101 are exposed from the mold compound 103 and form electrical terminals for the packaged electronic device. The electronic device package 100 can be mounted to a circuit board or module (not shown) using surface mount technology (SMT). Package sizes for packaged electronic devices are continually decreasing, and currently can be several millimeters on a side to less than one millimeter on a side, although larger and smaller sizes are also used. Future package sizes may be smaller. A JEDEC standard for a 6 terminal SOT package, an example package that is useful with the arrangements, is the SOT-23-6 package. An example of this package has a body that is about 3 millimeters long, and about 1.75 millimeters wide, and that the total package width including the leads to the ends of the leads is about 3 millimeters wide. The package body has a height of about 1.45 millimeters including the ends of the leads 101.

As seen in FIG. 1B, semiconductor die 105 is flip chip mounted to a die mount portion of a package substrate 109. In this example the package substrate 109 is a metal lead frame. Exposed portions of the lead frame form the leads 101. The die 105 is coupled to the lead frame by post connects 113. The post connects 113 can be, in an example, copper pillar bumps. Solder joints 111 are formed between the post connects 113 and the package substrate 109 (a lead frame) by a thermal reflow process. The solder joints 111 provide both mechanical connection and electrical connections between the semiconductor die 105 and the package substrate 109. The bottom of package 100 (as the package is oriented in FIG. 1B) is spaced from the bottom of the leads 101 by a spacing distance "S." This spacing distance "S" will be filled with ambient atmosphere when the device package 100 is surface mounted to a system board, and the thermal transfer path from the semiconductor die 105 to the board is then primarily through the leads 101 of the lead frame.

FIG. 1C illustrates, in an exploded projection view, electronic device package 100 with the leads 101, the package body formed by mold compound 103, the package substrate 109, and the semiconductor die 105 which is flip chip mounted to the package substrate 109. An active surface of the semiconductor die 105 faces the package substrate 109, so that as oriented in FIG. 1C, the semiconductor die 105 faces up, and has a backside surface facing downwards, towards the board side of the package 100. When the package 100 is surface mounted to a board (not shown) using the ends of the leads 101 soldered to the board, the backside of semiconductor die 105 will face the board. The thermal path from the semiconductor die 105 to the board is primarily through the bottom portions of leads 101, which are relatively small surfaces.

Figure 2A:
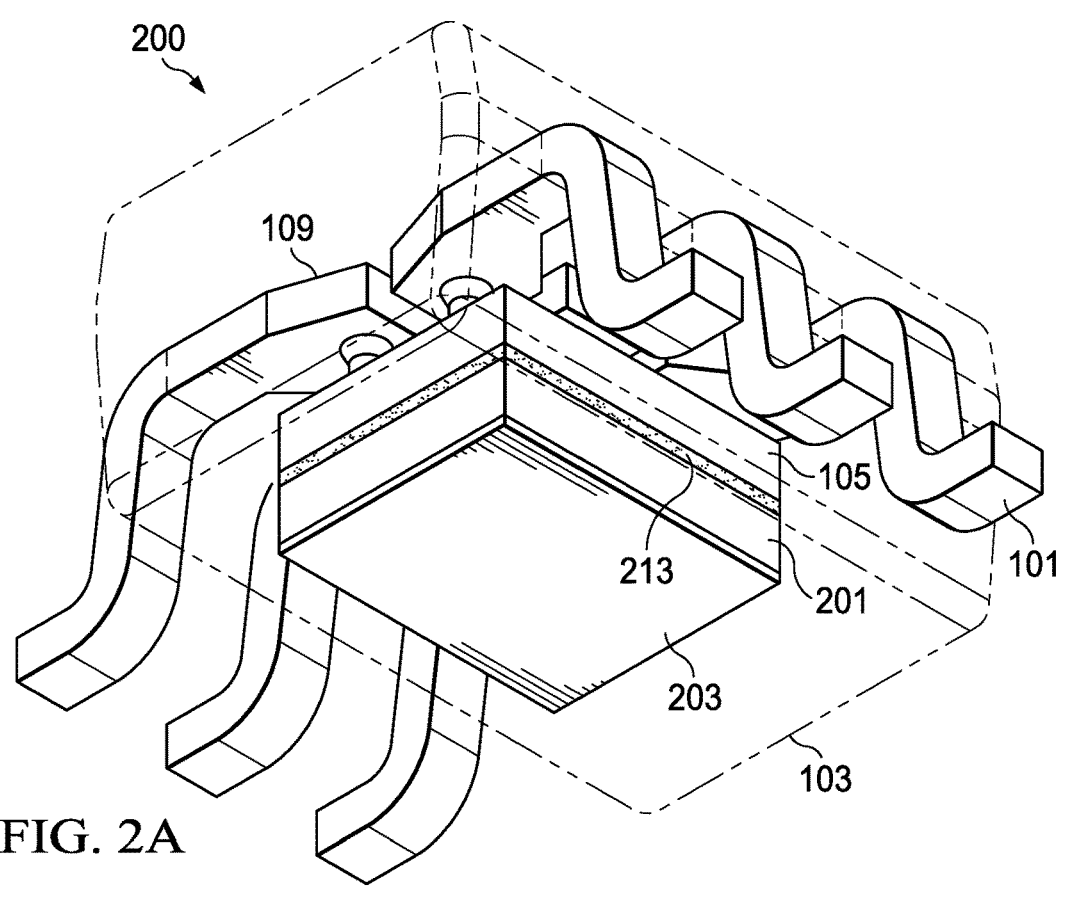
FIGS. 2A-2C illustrate, in a projection view looking from a bottom side, a cross section, and another cross sectional view with a circuit board, respectively, an arrangement in an SOT package.
Figure 2B:
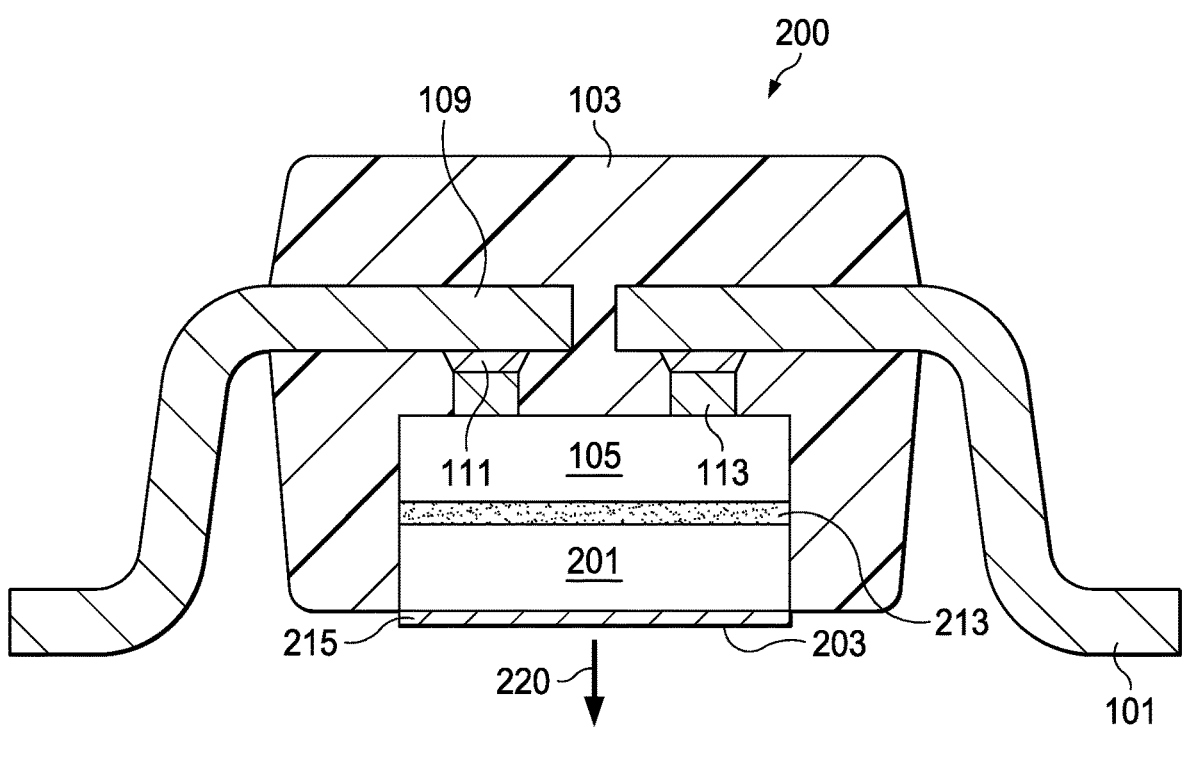

FIGS. 2A-2B illustrate, in a projection view and a cross sectional view, respectively, an arrangement for an SOT package 200. The arrangements can be used with other semiconductor device packages. As shown in FIG. 2A in a projection view, and in FIG. 2B in a cross section, semiconductor die 105 is mounted to a package substrate (a lead frame in this example) 109 by post connects 113 which are connected to the lead frame by solder joints 111. Semiconductor die 105 is mounted on a board side surface of the package substrate 109, the side facing a system board when the packaged device is mounted. Mold compound 103 forms a package body for the package 200. Leads 101 extend from the mold compound 103 and have end portions that are configured for surface mounting the packaged device to a board or module. A thermal interposer 201, which in an example is a silicon interposer, is shown mounted to the backside surface of semiconductor die 105 by a die attach, 213. The die attach material is a thermally conductive adhesive, and can be a tape, film, or liquid when dispensed, and then cured. The thermal interposer 201 is a thermally conductive material that has a surface 203 exposed from the bottom of the package 200 formed by mold compound 103. In example arrangements, the thermal interposer 201 is a semiconductor material, and in particular, silicon is used in some example arrangements. Ceramic materials such as aluminum oxide or aluminum nitride can be used. A silicon thermal interposer has a similar coefficient of thermal expansion (CTE) as the semiconductor die 105, and therefore mechanical stresses due to thermal expansion or contraction between the two materials will be reduced or eliminated. The thermal interposer 201 with bottom surface 203 exposed from the mold compound 103 provides a solderable surface for connection to a thermal pad on a printed circuit board. As indicated by the downwards arrow 220 in FIG. 2B, thermal energy is dissipated from the semiconductor die 105 through the thermal interposer 201, which greatly improves the thermal transfer from the semiconductor die 105 to a printed circuit board (see FIG. 2C). A plating 215, which can be copper, tin, nickel, gold, silver, palladium, or another layer which increases solderability, can be formed on the surface 203 prior to surface mounting the package 200. Multilayer plating systems for solderability such as ENIG (electroless nickel, immersion gold) and ENEPIG (electroless nickel, electroless palladium, immersion gold) can be used for plating 215.

Figure 2C:
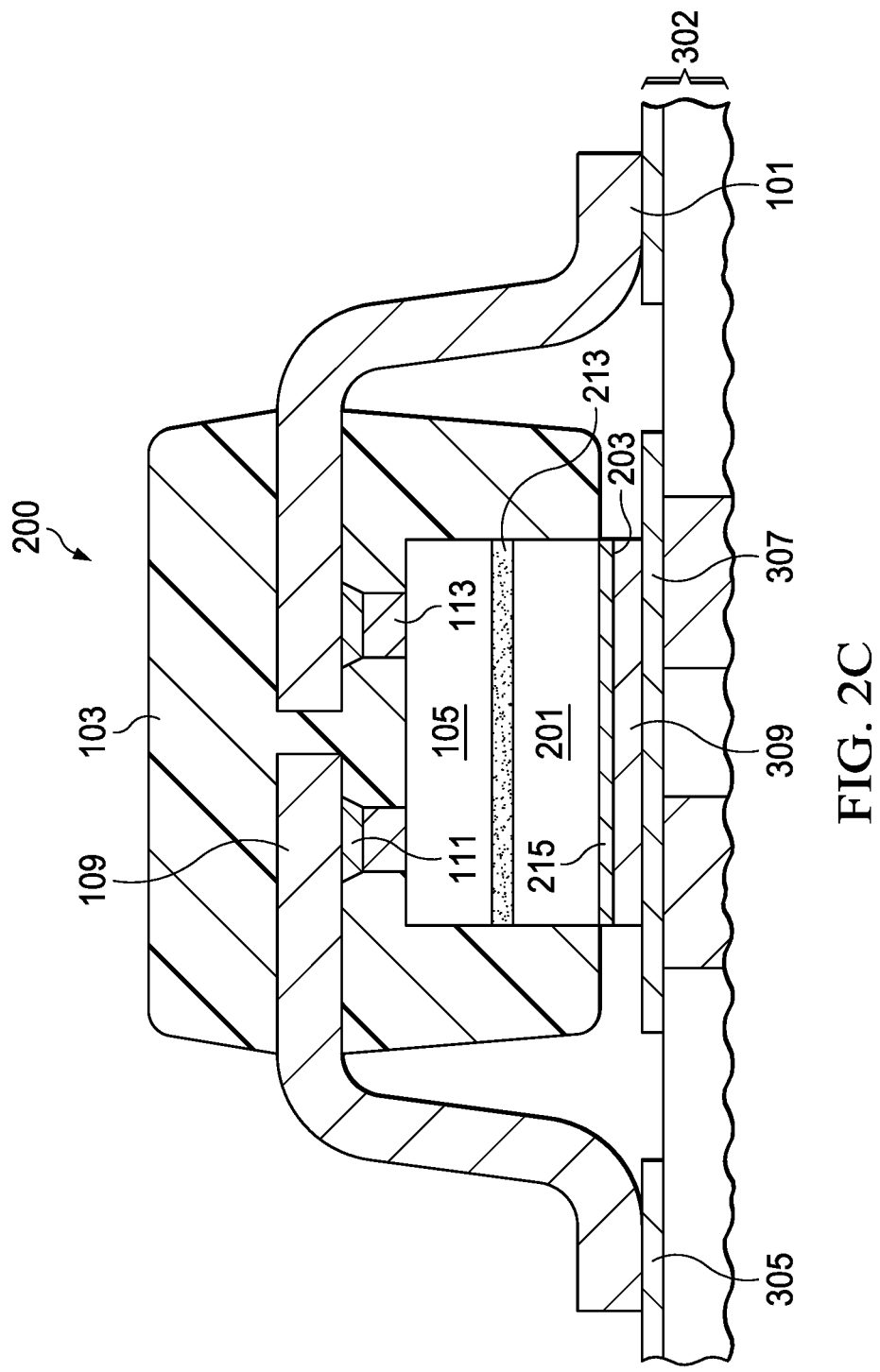

FIG. 2C is a cross sectional view of the package 200 of FIGS. 2A-2B now shown surface mounted to a printed circuit board 302. The printed circuit board 302 has conductive pads 305 that are exposed from dielectric materials such as a solder mask layer. The conductive pads 305 are used to surface mount the package 200 by solder that forms solder joints. Leads 101 are soldered to the conductive pads 305 and the bottom surface 203 (and plating layer 215) of the thermal interposer 201 is also mounted to a conductive thermal pad 307 on the printed circuit board 302 by a solder joint 309. By providing a thermal path from the backside of the semiconductor die 105 through the mold compound 103 to the printed circuit board. 302, the thermal performance of the package 200 is greatly improved (when compared to the package 100 of FIGS. 1A-IC). Some thermal dissipation will also occur through leads 101 into the conductive pads of the circuit board 302. The mold compound 103 can include metallic fillers to further increase thermal performance.

Figure 3A:
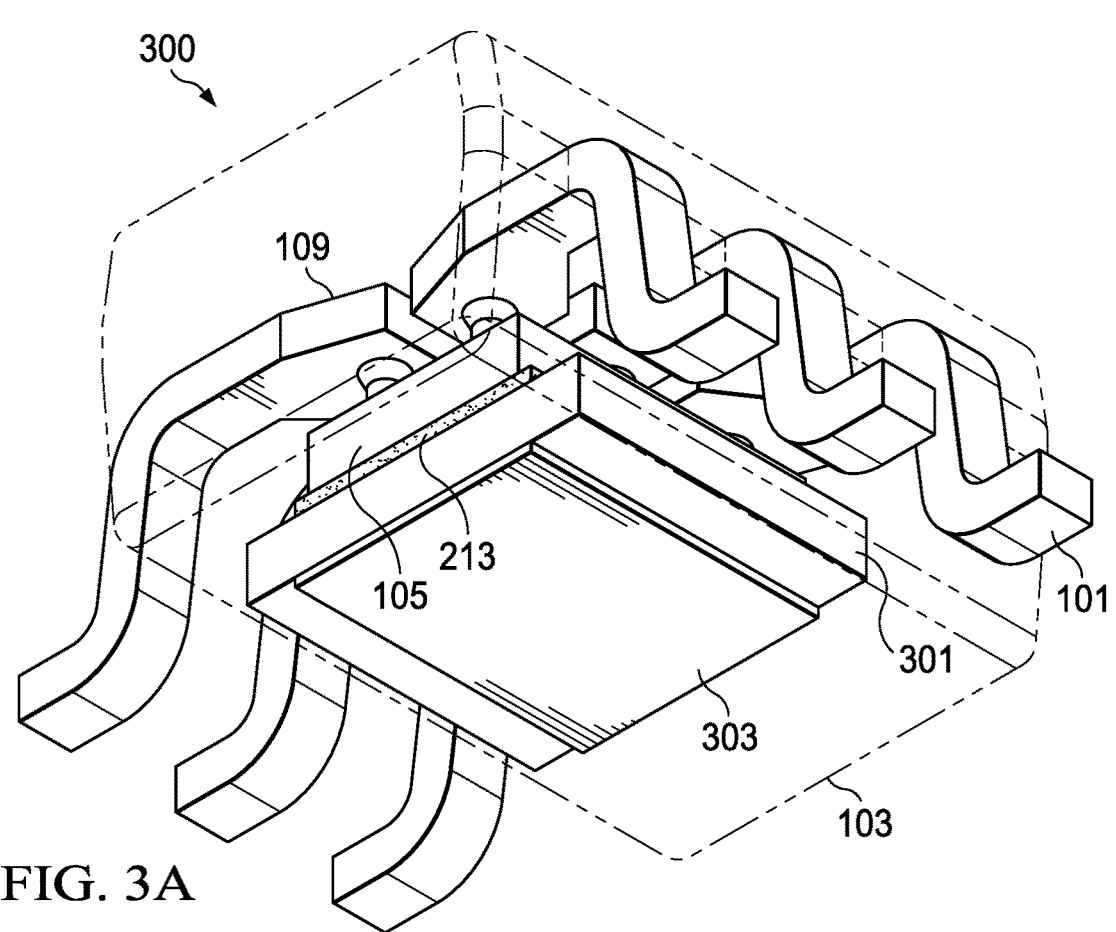
FIGS. 3A-3B illustrate, in a projection view and a cross sectional view, respectively, an alternative arrangement for an SOT package, and the package to surface mounted to a printed circuit board.
Figure 3B:
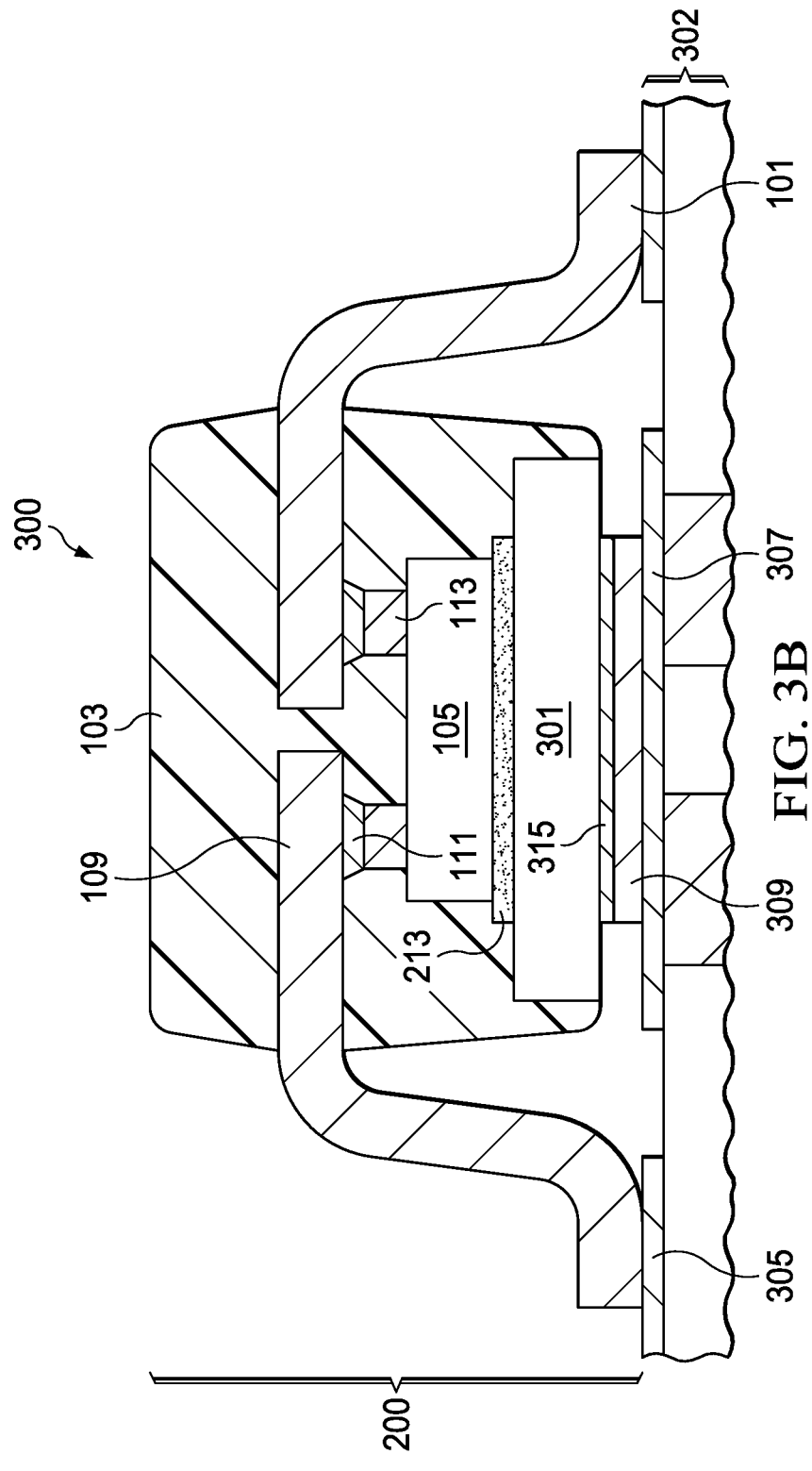

FIGS. 3A-3B illustrate, in a projection view and a cross section, respectively, an alternative arrangement for a package 300. In FIGS. 3A-3B, a thermal interposer 301 is shown that is larger than the semiconductor die 105 in area, which can further increase thermal performance of the package 300 (when compared to the package 200 in FIGS. 2A-2C). In an example, the thermal interposer 301 is semiconductor material, and in a particular example, is silicon. As is further described below, the use of a semiconductor material allows efficient assembly of the thermal interposers and the semiconductor dies in a wafer level process (WLP) assembly method. The semiconductor material for the thermal interposer 301 will also have a CTE that matches the CTE of the semiconductor die 105, reducing any stresses that might otherwise occur in thermal expansion and contraction due to differing CTE between differing materials.

FIG. 3A illustrates in a projection view the package 300 including the mold compound 103 forming a package body, the package substrate 109, the leads 101, and the semiconductor die 105 that is flip chip mounted to the package substrate 109. The thermal interposer 301 is attached by a die attach 213 to the semiconductor die 105, and is larger in area than the thermal interposer 201 in FIGS. 2A-2C, and is larger in area than the semiconductor die 105, increasing the thermal performance of the package 300.

FIG. 3B illustrates in a cross section the package 300 now mounted to a circuit board 302. The thermal interposer 301 has a plating 315 to increase solderability, and solder 309 couples the thermal interposer 301 to the thermal pad 307 on the circuit board 302, providing an efficient thermal transfer to the circuit board 302 from the semiconductor die 105.

Figure 4B:
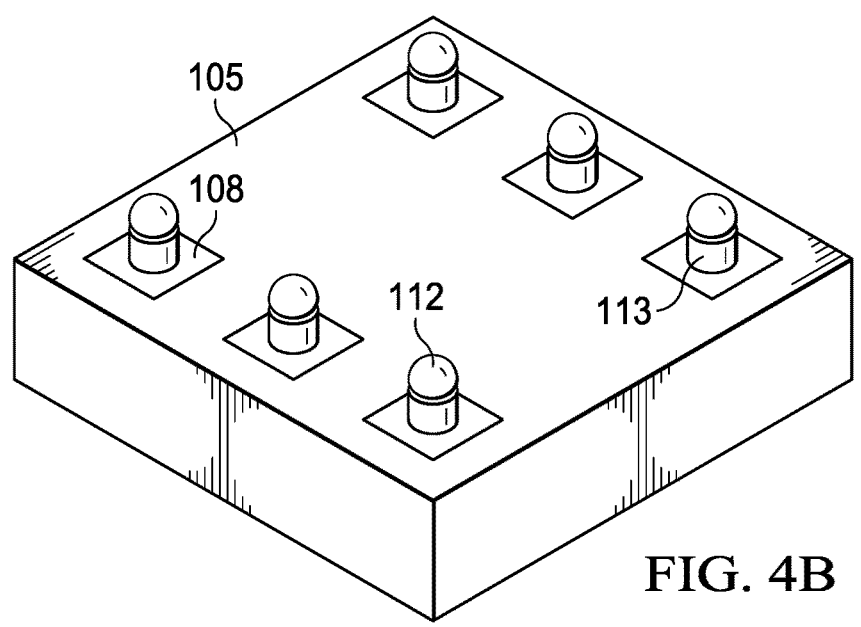
FIGS. 4A-4B illustrate in a projection view and a close up view, respectively, semiconductor dies on a semiconductor wafer with post connects and solder bumps.
Figure 4A:
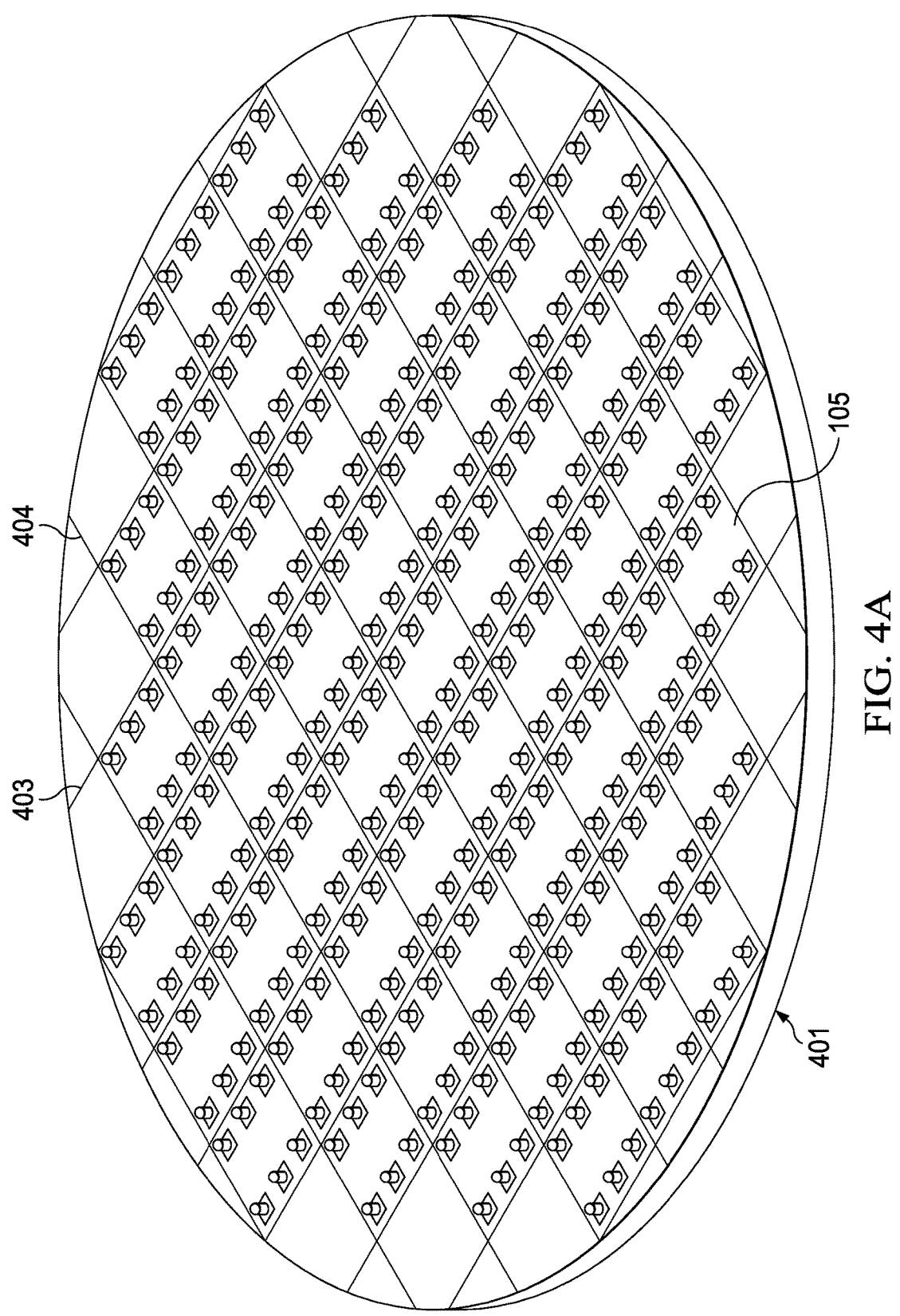

FIGS. 4A-4B illustrate steps used in forming a semiconductor die with post connects. In FIG. 4A, a semiconductor wafer 401 is shown with an array of semiconductor dies 105 in rows and columns formed on an active surface of the semiconductor wafer 401. The semiconductor dies 105 are formed using manufacturing processes in a semiconductor manufacturing facility, including ion implant doping, anneals, oxidation, dielectric and metal deposition, photolithography, pattern, etch, chemical mechanical polishing (CMP), electroplating, and other processes for making semiconductor devices. Vertical and horizontal (as the wafer is oriented in FIG. 4A) scribe lanes 403 and 404, which are perpendicular to one another and which run in parallel groups across the wafer 401, separate the rows and columns of the completed semiconductor dies, and provide areas for dicing the wafer to separate the semiconductor dies 105 from one another.

FIG. 4B illustrates a single semiconductor die 105, with bond pads 108, which are conductive pads that are electrically coupled to devices (not shown for simplicity) formed in the semiconductor die 105. Conductive post connects 113 are shown extending away from a proximate end mounted on the bond pads 108 on the active surface of semiconductor die 105, and solder bumps 112 are formed on the distal ends of the conductive post connects 113. The conductive post connects 113 can be formed by electroless plating or electroplating. In an example, the conductive post connects 113 are copper pillar bumps. Copper pillar bumps can be formed by sputtering a seed layer over the surface of the semiconductor wafer 401, forming a photoresist layer over the seed layer, using photolithography to expose the bond pads 108 in openings in the layer of photoresist, plating the copper conductive post connects 113 on the bond pads, and then plating a lead solder or a lead-free solder such as an tin-silver (SnAg) or tin-silver-copper (SnAgCu) solder to form solder bumps 112 on the copper conductive post connects 113. Other conductive materials can be used for the conductive post connects in an electroplating or electroless plating operation, including silver, nickel, palladium, gold, or tin, for example. The photoresist is then stripped, and the excess seed layer is etched from the surface of the wafer. The semiconductor dies are then separated by dicing, or are singulated, using the scribe lines 403, 404 (see FIG. 4A).

Figures 5A, 5B, 5C:
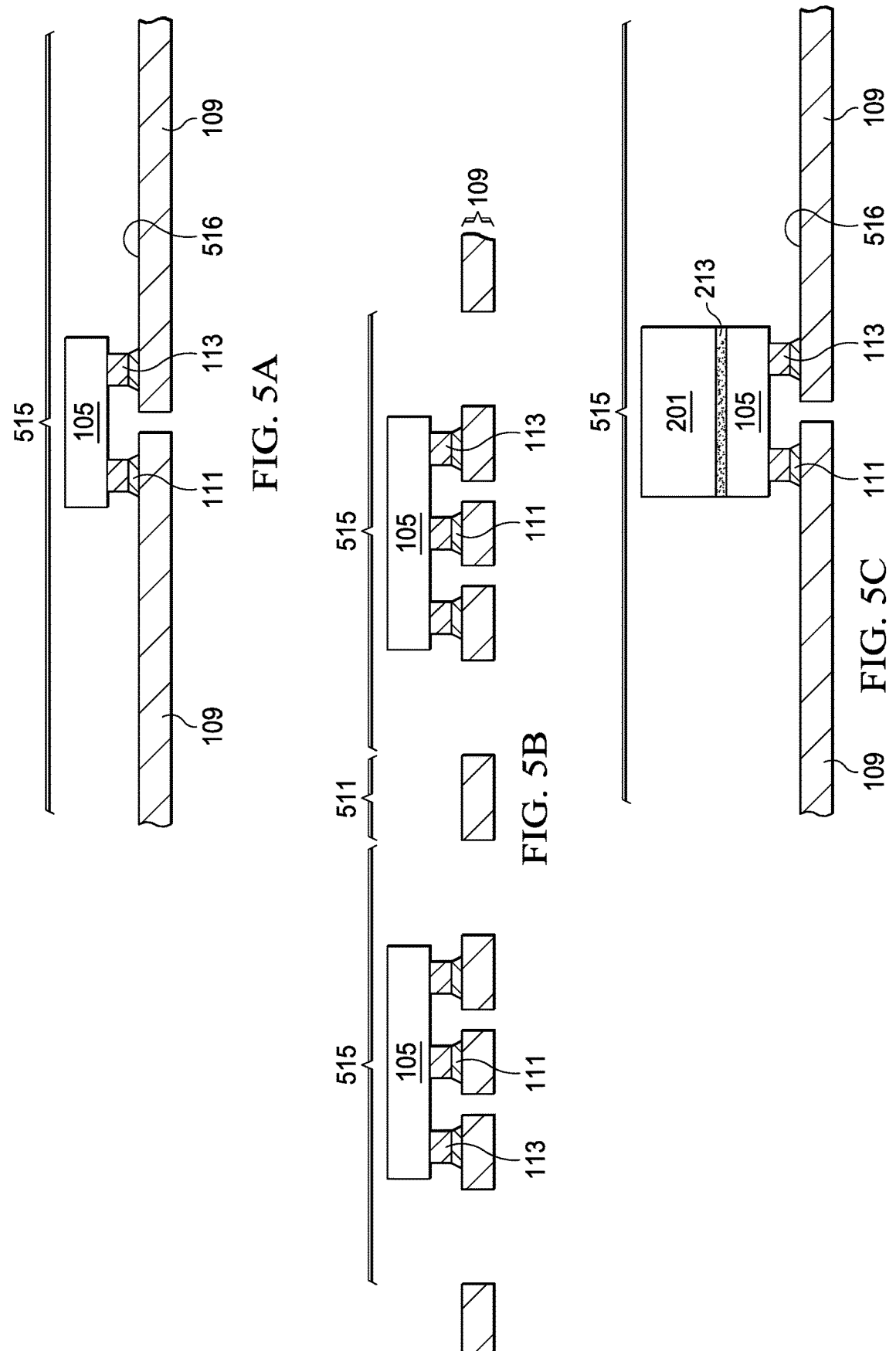

FIGS. 5A-5H show, in a series of cross sectional views, an example process for packaging semiconductor dies 105 to form arrangements. FIGS. 5A-5B show, in a cross sectional view and a side view, the process of mounting the semiconductor dies 105. The semiconductor dies 105 are flip chip oriented, with the active surface of the semiconductor dies 105 facing a die mount portion of a die mounting surface 516 of package substrate 109. In the illustrated example, the package substrate 109 is a conductive lead frame. The lead frames may be provided in a grid or matrix of units with an array of units in rows and columns, the unit lead frames 515 in a strip or array is spaced from adjacent unit lead frames by saw streets 511. The use of the grid or matrix enables many packaged units to be assembled in a single production run, increasing productivity. However, in an alternative approach, a single unit can be individually assembled. The unit lead frames 515 have a conductive surface 516 and may include plated areas (not shown) to receive solder bumps. Example plating layers include tin, silver, gold, nickel, palladium, platinum, ENIG and ENEPIG that are used to improve solderability and reduce diffusion can be used over the mounting surface 516, alternatively these materials may be selectively formed at the solder joint positions by spot plating.

FIG. 5A illustrates in a cross sectional view a semiconductor die 105 flip chip mounted to the mounting surface 516 of a package substrate 109, a unit lead frame 515 is illustrated in the cross section. Solder joints 111 are formed by a thermal reflow process to melt the solder bumps (see FIG. 4B, solder bumps 112) at the distal ends of the conductive post connects 113. In FIG. 5B, in a side view of the package substrate 109, two dies 105 are shown flip chip mounted to respective individual unit lead frames 515 and spaced by a saw street 511 between the unit lead frames 515. The solder joints 111 provide both mechanical attachment and electrical connection between the semiconductor devices die 105 and the package substrate 109.

FIG. 5C is another cross sectional view of the package substrate 109 from FIG. 5A, after additional processing steps. In FIG. 5C, the unit leadframe 515 is a portion of package substrate 109, in this example a lead frame associated with the semiconductor die 105, and a thermal interposer 201 is positioned over the backside of the semiconductor die 105, and is attached to the backside of the semiconductor die 105 with die attach 213. In an example, the die attach 213 can be die attach film, which allows for more precise material control than alternatives such as liquid die attach epoxy, however, die attach material of any type can be used in the arrangements. In the orientation of FIG. 5C, the board side surface of the semiconductor dies 105 is oriented upwards, the package substrate 109 has a surface 516 that is a board side surface for mounting the semiconductor dies. The thermal interposer 201 is shown positioned above the backside surface of die 105 (as the devices are oriented in FIGS. 5A-5J), for processing.

Figures 5D, 5E:
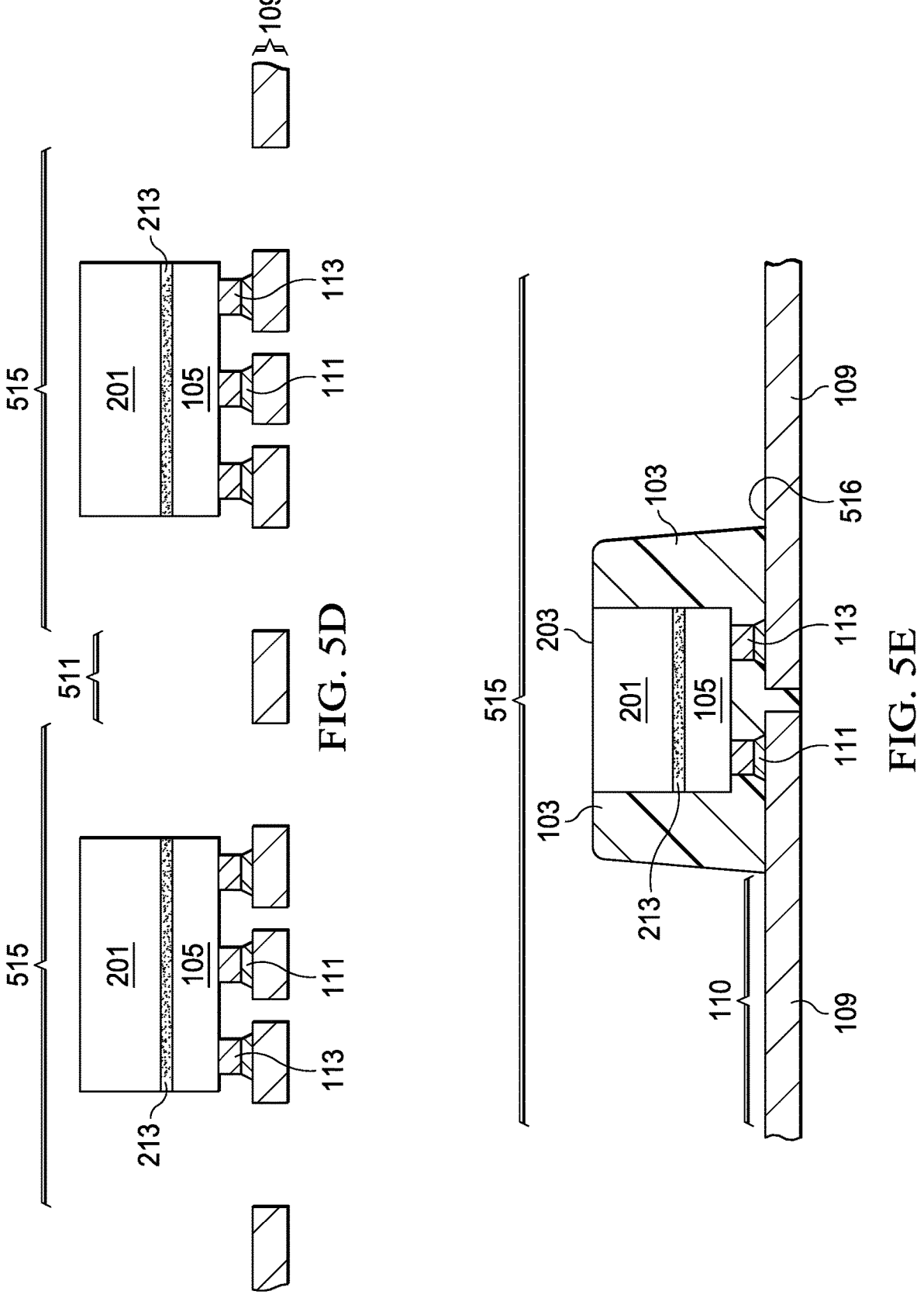

FIG. 5D shows the package substrate 109 in a side view with the unit lead frames 515 spaced by a saw street 511, the semiconductor die 105 has a thermal interposer 201 positioned above the backside or board side surface of the semiconductor die 105. The thermal interposers 201 in this example are formed with an area in correspondence with the semiconductor dies, as shown above the thermal interposers can alternatively have a greater area than the semiconductor dies. For the unit lead frames 515 there is a corresponding thermal interposer 201 that will be positioned over and attached to the corresponding semiconductor die 105. In some arrangements, the package substrate 109 may be a single column or row of unit devices, while in other arrangements, the unit devices can be arranged in an array of rows and columns, or a two dimensional matrix.

Figures 5F, 5G:
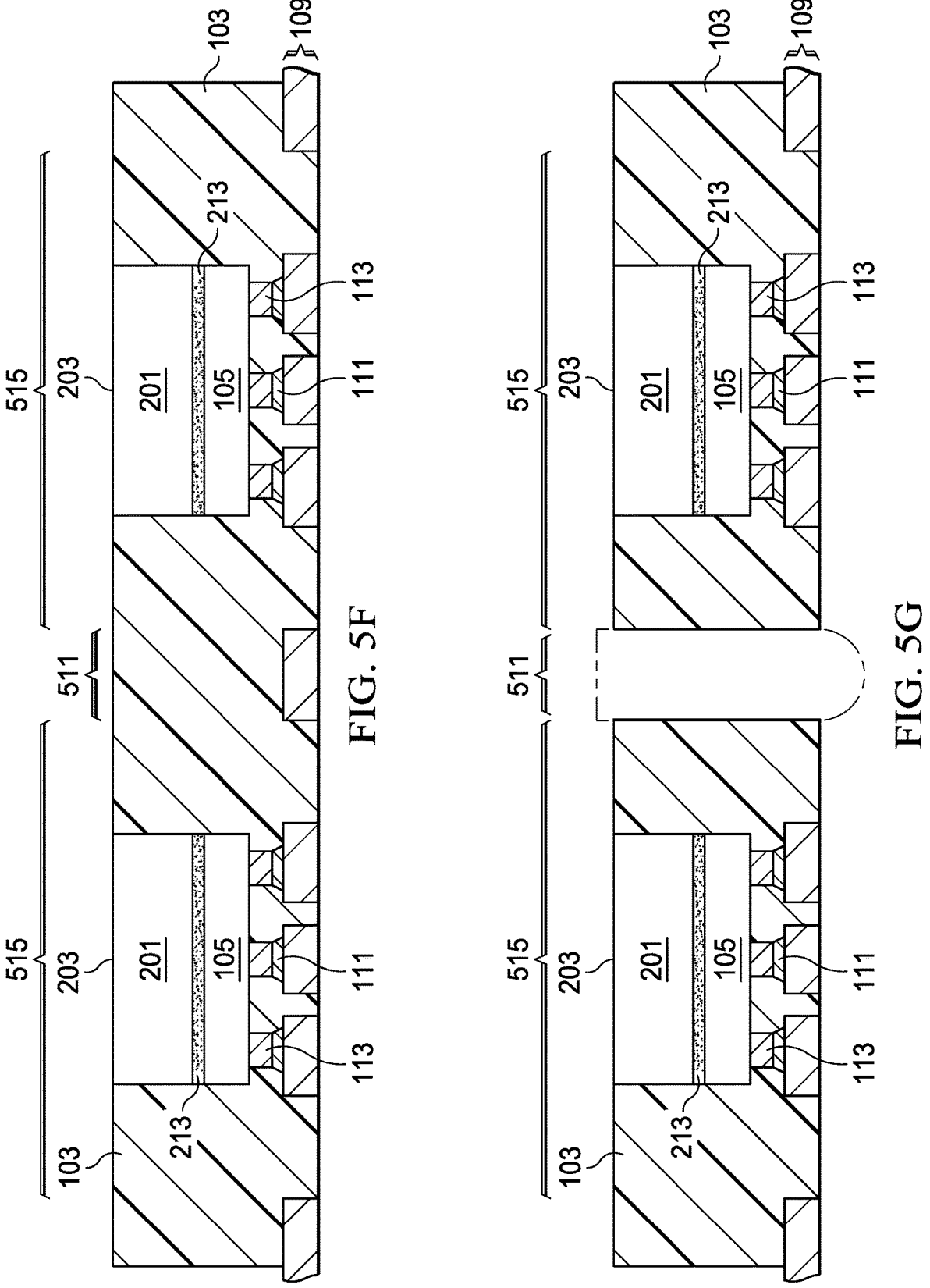

FIG. 5E shows in a cross section, and FIG. 5F shows in a side view, the package substrate 109 of FIGS. 5C and 5D after additional processing. An encapsulation process is used to form packages using mold compound 103 in a molding operation to cover the devices. In FIG. 5E, in a cross sectional view, the thermal interposer 201 has a surface 203 that is exposed from the mold compound 103. Further, although not shown in FIGS. 5D-5D for clarity, the surface 203 can be plated with a plating layer that enhances solderability of the thermal interposer 201, for example, copper, nickel, silver, palladium, or gold plating can be used, and multilayer plating can be used. The package substrate 109 has portions 110 that are exposed from the mold compound 103, these will be shaped to form leads for the completed packages.

In FIG. 5F, the package substrate 109 is covered by the mold compound 103. The mold compound covers the semiconductor dies 105 and portions of the package substrate 109, while the surface 203 of the thermal interposer 201 for the units is exposed from the mold compound 103. The unit lead frames 515 are spaced form one another by a saw street 511 which will be used in a singulation process to separate the completed devices.

FIG. 5G illustrates in a cross sectional view the package substrate 109 showing the separation of devices after a sawing operation saws through the saw street 511, cutting through the mold compound 103 and the package substrate 109 to separate the units on lead frames 515.

FIG. 5H illustrates in a cross sectional view a packaged electronic device 500 formed after further processing steps. The units formed by the sawing operation shown in FIG. 5G are subjected to a trim and form step to form leads 101 extending from the packaged bodies formed by mold compound 103. The packaged electronic device 500 uses "top side cooling", thermal energy from semiconductor die 105 is transmitted through the thermal interposer 201 out of the top surface of the package at surface 203, as indicated by the upwards arrow 513 in FIG. 5H.

Referring to again FIG. 2B, the device package 200 of FIG. 2B can also be formed starting with the unit lead frames at the stage shown in FIG. 5D. The package substrate 109 can be molded to form a "board side cooling" package arrangement so that the thermal interposer 201 is exposed at the bottom surface of the device package 200 as shown in FIG. 2B. The leads 101 can be formed in a trim and form step to extend alongside the molded package body formed by mold compound 103 and form surfaces for mounting to the printed circuit board as shown in FIG. 2C, so that the leads 101 and the thermal interposer 201 are coupled to the printed circuit board 302, and thermal energy from the semiconductor die 105 is transferred into the board. The methods of FIG. 5A-5G can be used to form the arrangements of FIGS. 2A-2C, the alternative arrangements of FIGS. 3A-3B, both "board side cooling" packages, and the additional alternative arrangement of FIG. 5H, a "top side cooling" package 500.

FIG. 6 illustrates in a flow diagram selected steps of a method for forming the arrangements as described with respect to FIGS. 5A-5H.

At step 601, semiconductor dies are flip chip mounted on a package substrate (see FIGS. 5A-5B). Solder bumps at the distal ends of the post connects are placed on the package substrate. At step 603, solder joints are formed by a thermal reflow process that melts the solder bumps and mechanically and electrically connects the distal ends of the post connects to the package substrate (see FIGS. 5A-5B). At step 605, the thermal interposers 201 are placed over the semiconductor devices and attached to the semiconductor dies by die attach (see FIGS. 5C-5D). In step 607, the encapsulation process covers the semiconductor dies, the thermal interposers, the post connects and portions of the package substrate with mold compound (see FIGS. 5E-5F) At step 609, the packaged devices are singulated by a sawing operation where the package substrates and the mold compound are cut through in the saw streets between devices (see FIG. 5G). At step 611, the lead portions of the first lead frames that extend from the mold compound are trimmed and shaped to form the package leads, and complete the packaged devices. (See FIG. 5H, and FIGS. 2A, and 3A, for differing arrangements).

The use of the arrangements provides a packaged semiconductor device with enhanced thermal dissipation, without the need to change the design of the semiconductor die, or the package substrate, and using existing methods and tooling for making the devices. Use of semiconductor material, such as silicon, for the thermal interposers further matches the CTE of the semiconductor dies, reducing mechanical stress during contraction or expansion in heating or cooling of the devices. Although in the examples only a single semiconductor die is shown in a package, in alternative arrangements, additional components, and an additional semiconductor die, can be provided in the package.

The example packages illustrated in the drawings are leaded packages. For example, SOT packages are shown. Many other package types that use flip chip mounted semiconductor dies can be used in additional arrangements. In another alterative arrangement, a "no-lead" package such as a quad flat no-lead package can be used. In the no-lead packages, the terminals of the package formed by portions of the first lead frame are exposed from the mold compound but do not extend from the package body, so that the terminals are within the exterior boundary of the package body. Both leaded and no-lead types of packaged devices can be surface mounted to a printed circuit board.

FIGS. 7A-7G illustrate, in a series of cross sectional views, steps for forming the arrangements using wafer level processing (WLP) methods. At FIG. 7A, a semiconductor wafer 700 is shown with plating layers 715, which can enhance solderability to the semiconductor material. The semiconductor wafer 700 will form the thermal interposers described above and can be a silicon semiconductor wafer, or another type of semiconductor wafer. At FIG. 7B, the semiconductor wafer 700 is shown after a wafer thinning operation, for example a backgrinding operation, which thins the semiconductor wafer 700 by removing material from the backside.

Figures 7A, 7B, 7C, 7D, 7E:
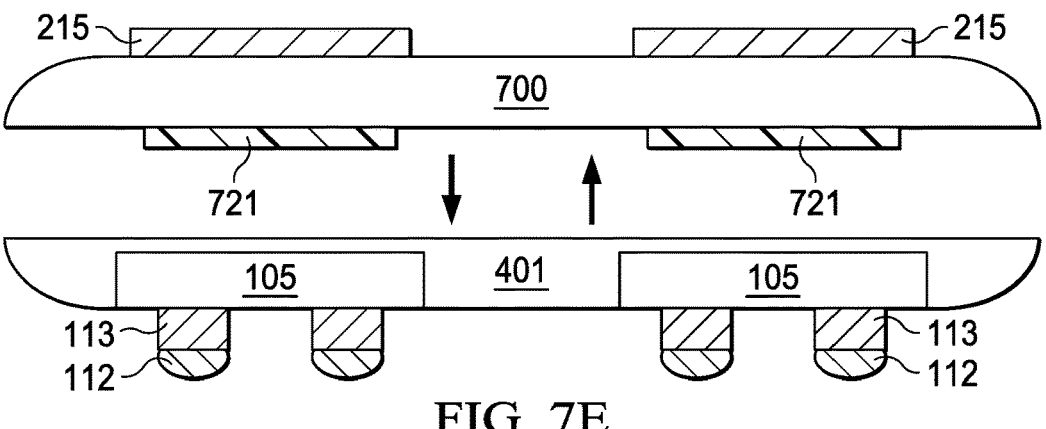

FIG. 7C illustrates in a cross section semiconductor wafer 401 (see the corresponding projection view in FIG. 4A) that has semiconductor dies 105 fabricated on an active surface. The semiconductor dies 105 have post connects 113 and solder bumps 112 formed to provide vertical connections for flip chip mounting to a package substrate. FIG. 7D illustrates in another cross section the semiconductor wafer 401 after a wafer thinning operation reduces the thickness, by backgrinding, for example, of semiconductor wafer 401 and to expose the backside of the semiconductor dies 105.

At FIG. 7E a wafer bonding step is shown. The first semiconductor wafer, 700, that will form the thermal interposers for the packaged devices, has an adhesive or die attach film 721 provided on the backside surface. (Alternatively, this material could be placed on the second semiconductor wafer 421). The two semiconductor wafers are bonded together, a cure step can be used, for example a temperature cure or an ultra-violet (UV) cure, to bond the two semiconductor wafers together. FIG. 7F illustrates the first semiconductor wafer 700 and the second semiconductor wafer 401 forming a bonded wafer 731 after the wafer bonding operation. A plated surface 215 on the first semiconductor wafer 700 is aligned with the semiconductor dies 105. The post connects 113 and solder bumps 112 are shown for the semiconductor dies 105.

FIG. 7G illustrates, in a cross sectional view, two of the unit devices formed by sawing apart the bonded wafer 731 (see FIG. 7F) into unit devices 723. The unit devices 723 are a semiconductor die 105 and a thermal interposer 201. The unit devices 723 are ready for flip chip assembly to a package substrate, molding, and then sawing apart the molded devices to form packaged devices, as shown in FIGS. 5C-5H above.

FIG. 8 illustrates, in a flow diagram, method steps for forming the arrangements of FIGS. 7A-7G. At step 801, thermal interposers are formed as portions of a first semiconductor wafer with plated surfaces on one side (see FIG. 7A). At step 803, the first semiconductor wafer with the plated surfaces is thinned using a backgrinding operation (see FIG. 7B). At step 802, post connects and solder bumps are formed on semiconductor dies that are formed on a second semiconductor wafer. At step 804, the second semiconductor wafer is thinned in a backgrinding operation. Note that as shown in FIG. 8, steps 801 and 803 are independent from one another, and can be performed independently of the steps 802 and 804; these steps can be done simultaneously or the steps can be done asynchronously at different times, and at different locations, without any coordination. At step 805, the first and second semiconductor wafers are bonded together at the backsides to form a bonded wafer 731 (see FIG. 7F). At step 807, the bonded wafer 731 is singulated by cutting or sawing between the unit devices to form individual unit devices, the unit devices are a semiconductor die and a thermal interposer bonded to the semiconductor die, with the post connects and the solder bump extending from the semiconductor die (see FIG. 7G). The unit devices are then ready for flip chip mounting, molding, and sawing operations as shown in FIG. 5C-5G above, to form packaged semiconductor devices. At step 809, the unit devices are flip chip mounted to a package substrate, and mold compound is used to encapsulate the devices. At step 811, the packaged devices are singulated by cutting through the package substrate and the mold compound in saw streets between the devices.

The arrangements described can be formed using semiconductor dies and thermal interposers that are assembled on a package substrate as shown in FIGS. 5A-5G, and using the method shown in the flow chart of FIG. 6; alternatively, the arrangements can be formed using WLP methods such as shown in FIGS. 7A-7G and using the method shown in the flow chart of FIG. 8. In the arrangements, the thermal interposers are in thermal contact with the semiconductor dies. In some arrangements the thermal interposer has a surface exposed from the bottom surface of a packaged electronic device and can be surface mounted to a system board, to provide board side cooling. In alternative arrangements, the thermal interposer is exposed at the top side of a packaged electronic device, and the top side surface of the packaged devices includes an exposed surface of the thermal pads to provide thermal dissipation by top side cooling. In simulations of packaged SOT devices, use of the arrangements has been shown to improve performance by up to 65% when compared to the same packaged SOT devices in use in a package formed without the thermal interposer.

Modifications are possible in the described arrangements, and other alternative arrangements are possible within the scope of the claims.

What is claimed is:

1. An apparatus, comprising:
   a package substrate having a die mount surface;
   a semiconductor die that is flip chip mounted to the package substrate on the die mount surface;
   a silicon interposer having a first surface attached to a backside surface of the semiconductor die, the silicon interposer having a second surface opposite the first surface covered with a plating layer, wherein the first surface of the silicon interposer is attached to the backside surface of the semiconductor die via a die attach material;
   a mold compound covering a portion of the package substrate, a portion of the silicon interposer, and the semiconductor die, the silicon interposer having the plating layer on the second surface that is an exposed surface from the mold compound; and
   a circuit board, wherein the plating layer is attached to the circuit board via a solder material, and wherein at least one sidewall of the silicon interposer is aligned with a sidewall of the semiconductor die.

2. The apparatus of claim 1, further comprising leads formed in the package substrate and extending from the mold compound.

3. The apparatus of claim 2, wherein the leads are shaped to extend alongside a portion of a package body formed by the mold compound, the leads having end portions configured for surface mounting to the circuit board.

4. The apparatus of claim 1, wherein the apparatus comprises a small outline transistor (SOT) package.

5. The apparatus of claim 1, wherein the package substrate comprises one of copper and copper alloys.

6. The apparatus of claim 1, wherein the package substrate comprises a metal lead frame.

7. The apparatus of claim 6, wherein the metal lead frame comprises one selected from copper, stainless steel, steel, alloy 42, and alloys thereof.

8. The apparatus of claim 1, wherein the plating layer comprises one of copper, nickel, tin, gold, silver, palladium, combinations of these, and alloys thereof.

9. An apparatus, comprising:

a first lead and a second lead of a semiconductor package;

a semiconductor die including a first pillar bump attached to the first lead and a second pillar bump attached to the second lead;

a silicon interposer having a first surface attached to an opposite side of the semiconductor die that includes the first pillar bump and the second pillar bump, the silicon interposer having a plating layer on a second surface that is opposite the first surface, wherein the silicon interposer is attached to the semiconductor die via a die attach material;

a mold compound covering a portion of the first lead and the second lead, the silicon interposer, the semiconductor die, the first pillar bump, and the second pillar bump, wherein the plating layer on the second surface of the silicon interposer is exposed from the mold compound; and a circuit board, wherein the plating layer is attached to the circuit board via a solder material, and wherein at least one sidewall of the silicon interposer is aligned with a sidewall of the semiconductor die.

10. The apparatus of claim 9, wherein the semiconductor package is a leaded package, and another portion of the first lead and the second lead extends from the mold compound.

11. The apparatus of claim 10, wherein the first lead and the second lead are shaped to extend alongside a portion of a package body formed by the mold compound, the first lead and the second lead having end portions configured for surface mounting to the circuit board.

12. The apparatus of claim 9, wherein the first pillar bump is attached to the first lead via solder and the second pillar bump is attached to the second lead via solder.

13. The apparatus of claim 9, wherein the semiconductor package is a small outline transistor (SOT) package.

14. The apparatus of claim 9, wherein the first lead and the second lead comprise one selected from copper, stainless steel, steel, alloy 42, and alloys thereof.

15. The apparatus of claim 9, wherein the plating layer comprises one of copper, nickel, tin, gold, silver, palladium, combinations of these, and alloys thereof.

* * * * *